United States Patent
Yue et al.

(10) Patent No.: US 8,433,972 B2
(45) Date of Patent: Apr. 30, 2013

(54) SYSTEMS AND METHODS FOR CONSTRUCTING THE BASE MATRIX OF QUASI-CYCLIC LOW-DENSITY PARITY-CHECK CODES

(75) Inventors: Guosen Yue, Plainsboro, NJ (US); Li Zhang, Davis, CA (US); Xiaodong Wang, New York, NY (US)

(73) Assignee: NEC Laboratories America, Inc., Princeton, NJ (US)

( * ) Notice: Subject to any disclaimer, the term of this patent is extended or adjusted under 35 U.S.C. 154(b) by 626 days.

(21) Appl. No.: 12/695,315

(22) Filed: Jan. 28, 2010

(65) Prior Publication Data

US 2010/0257425 A1    Oct. 7, 2010

Related U.S. Application Data

(60) Provisional application No. 61/166,822, filed on Apr. 6, 2009.

(51) Int. Cl.
*H03M 13/00* (2006.01)
*G11C 29/00* (2006.01)

(52) U.S. Cl.
USPC .......................................... 714/758; 714/763

(58) Field of Classification Search .................. 714/758, 714/763
See application file for complete search history.

(56) References Cited

U.S. PATENT DOCUMENTS 8,103,931 B2 * 1/2012 Wang et al. .................... 714/755
2011/0179333 A1 * 7/2011 Wesel et al. .................... 714/752

OTHER PUBLICATIONS

Sharon, E., et al. Constructing LDPC Codes by Error Minimization Progressive Edge Growth. IEEE Transactions on Communications. vol. 56, No. 3. Mar. 2008. pp. 359-368.
Tian, T., et al. Construction of Irregular LDPC Codes With Low Error Floors. IEEE International Conference on Communications. ICC '03. vol. 5. May 2003. pp. 3125-3129.
Tian, T., et al. Selective Avoidance of Cycles in Irregular LDPC Code Construction. IEEE Transactions on Communications. vol. 52, No. 8. Aug. 2004. pp. 1242-1247.
Yue, G., et al. Analysis and Design of Finite-Length LDPC Codes. IEEE Transactions on Vehicular Technology. vol. 56, No. 3. May 2007. pp. 1321-1332.

* cited by examiner

*Primary Examiner* — Cynthia Britt
(74) *Attorney, Agent, or Firm* — Joseph Kolodka; James Bitetto

(57) ABSTRACT

Construction of base matrices for quasi-cyclic (QC)-low density parity-check codes (LDPC) using two novel metrics are described. Design constraints based on a local girth and a local minimum approximate cycle extrinsic message degree (ACE) of variable nodes in the base matrix are employed. In particular, various local girth and local minimum ACE constraints can be set for different lift sizes. Additionally, the base matrix can be configured as a universal base matrix from which different base matrices having different corresponding lift sizes that comply with the design constraints can be obtained and used to generate QC-LDPC codes.

18 Claims, 5 Drawing Sheets

SYSTEMS AND METHODS FOR CONSTRUCTING THE BASE MATRIX OF QUASI-CYCLIC LOW-DENSITY PARITY-CHECK CODES

RELATED APPLICATION INFORMATION

This application claims priority to provisional application Ser. No. 61/166,822 filed on Apr. 6, 2009, incorporated herein by reference.

BACKGROUND

1. Technical Field

The present invention generally relates to designing low-density parity-check codes (LDPC) and, more specifically, to methods and systems for constructing base matrices of quasi-cyclic (QC)-LDPC.

2. Description of the Related Art

Several different design methods for constructing QC-LDPC codes have been explored and studied. In particular, many of such methods employ algebraic and combinatorial technologies. The design criterion of the algebraic construction is to increase the minimum distance, i.e., $d_{min}$, which can correspond to, for example, the Hamming distance of the codeword set. Using these methods, different code block lengths can be obtained by changing the size of cyclic submatrices based on algebraic properties. Other types of QC-LDPC design methods include pseudo-random LDPC construction approaches, which utilize certain code graph metrics to design the QC-LDPC code for iterative decoding.

For example, in one approach, the QC-LDPC codes are constructed using a progressive edge growth (PEG) technique. Here, a base matrix structure and a single targeted lifting size are used to construct a base matrix for QC-LPDC with the targeted lifting size such that the lower bound of the codeword error probability (WER) is minimized. The design criterion is to construct QC-LDPC codes that provide a minimized block error probability (BEP) or BEP upper bound in Binary Erasure Channels (BEC), which is formulated based on the e-cycle. Specifically, e-cycles are searched to evaluate the lower bound of the WER. The design is configured for a particular lifting size L.

SUMMARY

Exemplary embodiments of the present invention introduce two novel metrics, local girth and local minimum approximate cycle extrinsic message degree (ACE), that can be used to design and construct QC-LDPC codes. In particular, properties of the novel metrics facilitate efficient design of QC-LDPC codes that provide considerable WER performance gains. Furthermore, in certain exemplary implementations, the metrics can be employed to generate a universal base matrix from which base matrices with different lifting sizes meeting pre-determined design constraints can be obtained for designing QC-LDPC codes.

One exemplary embodiment of the present invention includes a system for constructing a QC-LDPC base matrix comprising a design module and an evaluation module. The design module can be configured to construct a QC-LDPC base matrix using design constraints including a local girth constraint for variable nodes imposed for one or more lift sizes. In turn, the evaluation module can be configured to support construction of the QC-LDPC base matrix by computing and providing the local girth of variable nodes in the QC-LDPC matrix. Using the computed local girth, the design module can determine whether variable nodes in the QC-LDPC base matrix satisfy the local girth constraint for a corresponding lift size.

An alternative exemplary embodiment of the present invention includes a method for encoding information bits using QC-LDPC. The method may comprise receiving one or more targeted lift sizes and one or more design constraints for a QC-LDPC base matrix. The design constraint may include a local girth constraint for variable nodes in the QC-LDPC base matrix. The method may further comprise constructing the QC-LDPC base matrix based on the local girth constraint and encoding the information bits in accordance with the QC-LDPC base matrix for transmission to a receiver.

Another exemplary embodiment of the present invention includes a computer readable storage medium tangibly embodying a computer readable program including instructions for performing a method for generating a universal base matrix. Here, QC-LDPC parity check matrices can be obtained from the universal base matrix with various lift sizes to encode information bits. The method may include receiving one or more design constraints for one or more lift sizes that can include a local girth constraint and a local minimum ACE constraint for variable nodes for at least one QC-LDPC base matrix. In addition, an initial universal base matrix can be generated. Using one or more design constraints and the initial universal base matrix, the universal base matrix can be iteratively evaluated and adjusted for each lifting size so that it satisfies the design constraints.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

As noted above, QC-LDPC codes may be constructed and designed using two novel metrics: local girth and the local minimum approximate cycle extrinsic message degree (ACE). QC-LDPC design processes can use the definitions of the local girth and the local minimum ACE, discussed further herein below, to construct a base matrix from which the QC-LDPC codes can be obtained. In accordance with exemplary embodiments, a QC-LDPC universal base matrix can be used to generate LDPC codes with various block lengths by changing the lift size of the base matrix. As opposed to global graph constraints, the structure of the matrix may be based on local girth and local minimum ACE constraints. One property of the local girth and the local minimum ACE is that nodes in the same column and circulant QC-LDPC have the same local girth and local minimum ACE. Thus, use of the local girth and the local minimum ACE metrics can facilitate efficient code design, as one representative node can be evaluated to determine whether a group of nodes satisfy the constraints. In addition, QC-LDPC design processes can set different graph constraints for different lift sizes of a base matrix. Because graph constraints can be varied for different lift sizes, constraints on the local girth and the local minimum ACE can be loosened gradually for small code block sizes. Furthermore, it can be shown that the resulting QC-LDPC codes using design methods and systems discussed herein below perform well for a large range of block sizes.

Prior to discussing exemplary implementations for constructing QC-LDPC codes, basic properties of LDPC codes and QC-LDPC codes will be described to permit ease of understanding of aspects of the present invention described further below. In consideration of LDPC codes, denote N, K, and M as the length of codeword, information sequence, and parity constraints, respectively, for a forward error correction code (FEC) code. An LDPC code is a linear block code specified by an M×N very sparse parity check matrix H. The parity check matrix can also be represented by a bipartite graph which consists of two types of nodes—variable nodes and check codes. Each code bit is a variable node while each parity check or each row of the parity check matrix represents a check node. An edge in the graph is placed between variable node i and check node j if $H_{j,i}=1$; further, no parallel edges are permitted between a particular variable node/check node pair.

Figure 1:
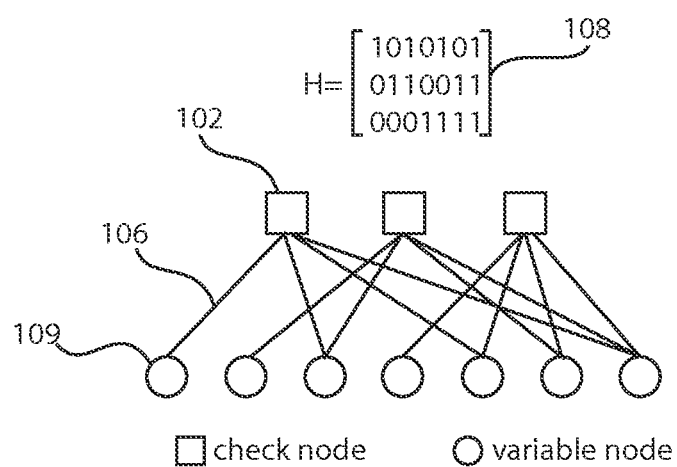
FIG. 1 is a bipartite Tanner graph representation of an LDPC code in accordance with exemplary embodiments of the present invention.

Each check node is connected to code bits whose sum modulo-2 should be zero. Irregular LDPC codes are specified by two polynomials $$\lambda(x) = \sum_{i=1}^{d_{l_{max}}} \lambda_i x^{i-1}$$

and $$\rho(x) = \sum_{i=1}^{d_{l_{max}}} \rho_i x^{i-1},$$

where $\lambda_i$ is the fraction of edges in the bipartite graph that are connected to variable nodes of degree i, and $\rho_i$ is the fraction of edges that are connected to check nodes of degree i. The ensemble of irregular LDPC codes are denoted by the set of $\lambda_i$ and $\rho_i$. Graph 100, shown in FIG. 1, is an example of a code graph for a block code. In particular, code graph 100, comprised of variable nodes 102, check nodes 104 and edges 106, represents a (7, 4) Hamming code for parity check matrix 108.

A QC-LDPC code, in turn, can be specified by a parity check matrix which comprises small square submatrices of the same size L. Each submatrix is either a zero matrix or a permutation matrix that is cyclically shifted from an identity binary matrix. These permutation submatrices are also referred to as circulants. P is denoted as the submatrix which shifts the identity matrix to the right once and $P^j$ is denoted as the square submatrix which cyclically shifts the identity matrix to the right by j times. Thus, $P^0$ represents the identity matrix while P is the submatrix which cyclically shifts the identity matrix to the right once:

$$P^0 = I = \begin{bmatrix} 1 & & & \\ & 1 & & \\ & & \ddots & \\ & & & 1 \end{bmatrix} \text{ and } P = \begin{bmatrix} 0 & 1 & \cdots & 0 \\ & 0 & \ddots & \\ & & \ddots & 1 \\ 1 & & & 0 \end{bmatrix} \quad (1)$$

$P^{-1}$ is denoted as the zero matrix. Here, the LDPC code matrix can be assumed to be formed by $M_B \times N_B$ circulants. Thus, the parity check matrix of a QC-LDPC code can be defined by a $M_B L \times N_B L$ binary matrix H, given by $$H = \begin{bmatrix} P^{\alpha_{11}} & P^{\alpha_{12}} & \cdots & P^{\alpha_{1N_B}} \\ P^{\alpha_{21}} & P^{\alpha_{22}} & \cdots & P^{\alpha_{2N_B}} \\ \vdots & \vdots & \cdots & \vdots \\ P^{\alpha_{M_B 2}} & P^{\alpha_{M_B 2}} & \cdots & P^{\alpha_{M_B N_B}} \end{bmatrix}, \quad (2)$$

where $\alpha_{ij} \in \{-1, 0, 1, \ldots\}$ denotes the number of shifts of the circulant in the ith row and the jth column. If H is a full rank, the code rate is given by $$R = \frac{N_B - M_B}{N_B} = 1 - \frac{M_B}{N_B} \quad (3)$$

Accordingly, the code rate is not dependent on the size of circulants L. Hence, with different sizes of circulant, L, LDPC codes with various block lengths but of the same rate can be defined.

The parity check matrix can also be represented simply by $\{a_{ij}\}$. The resulting $M_B \times N_B$ matrix is termed the base matrix $H_B$, given by $$H_B = \begin{bmatrix} \alpha_{11} & \alpha_{12} & \cdots & \alpha_{1N_B} \\ \alpha_{21} & \alpha_{22} & \cdots & \alpha_{2N_B} \\ \vdots & \vdots & \cdots & \vdots \\ \alpha_{M_B 1} & \alpha_{M_B 2} & \cdots & \alpha_{M_B N_B} \end{bmatrix}. \quad (4)$$

The matrix $H_B$ defines a protograph of the LDPC code. Given a codeword $c = [c_0, c_1, \ldots, c_{N_B-1}]$ with the size of $c_i$ being L, with the same permutation for $c_i$, $i = 0, \ldots, N_B - 1$, it is clearly apparent that the resulting sequence is still a code word. Such a quasi-cyclic property can be represented by $$[c_0 P^j, c_1 P^j, \ldots, c_{N_B} P^j] \in C, \text{ if } c \in C. \quad (5)$$

The QC-LDPC code can also be viewed as the protograph lifted by L copies of the same bipartite graph as the protograph. The connections of L copies of variable nodes and check nodes that are lifted from the same variable node/check node pair are then cyclicly shifted by $\alpha_{ij}$ times. Therefore, L is also termed the lift size.

Graph Properties of QC-LDPC Codes

Based on the graph representation of an LDPC code, some basic definitions concerning a code graph that affect the block error performance of iterative LDPC decoding over a binary erasure channel (BEC) are provided. These definitions also read on the performance of the LDPC code in the additive white Gaussian noise (AWGN) channel and other channels.

Definition 1—Cycle and length of the cycle: A cycle denotes any undirected closed loop in a factor graph. The length of a cycle or cycle length is the number of edges between variable and check nodes that make up the cycle in the cycle loop.

Definition 2—Girth: The girth of an LDPC code is defined as the minimum cycle length among all cycles in the LDPC code.

Figure 2:
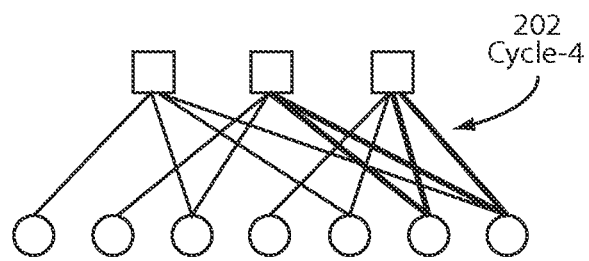
FIG. 2 is a bipartite Tanner graph representation of an LDPC code illustrating a cycle length in accordance with exemplary embodiments of the present invention.

A cycle 202 of length-4 is shown in FIG. 2 for the code graph example 100 provided in FIG. 1.

Designing the code graph to have a large girth constraint can permit the construction of well performing LDPC codes, particularly in the moderate and low rate regions. However, for an LDPC code having a relatively high code rate, due to a large check node degree and a lower number of check nodes, it is difficult to construct a code structure that has a large girth. Therefore, the use of a single girth constraint is not sufficient to design a set of well performed LDPC codes.

Recently, two metrics, the extrinsic message degree (EMD) and the approximate cycle EMD (ACE), have been introduced in prior works for constructing irregular LDPC codes:

Definition 3—Extrinsic message degree (EMD): An extrinsic check node of a variable-node set is a check node that has a single edge connection to this variable node set. The EMD of a variable-node set is the number of extrinsic check nodes of this variable node set.

Definition 4—Approximate Cycle EMD (ACE): Denote $d_i$, $i=1, \ldots, \theta$, as the degree of the $i^{th}$ variable node in a cycle of length-$2\theta$. The ACE of this cycle is $\Sigma_{i=1}^{\theta}(d_i-2)$. The ACE of a degree-d variable node is $d-2$, and the ACE of any check node is zero.

It is clear that the ACE of a cycle is actually the upper bound of the EMD for the cycle because at most $d-2$ extrinsic nodes are connected to a degree-d variable node in the cycle. Based on the definitions of EMD and ACE provided above, the following property for a LPDC code graph can be derived:

Property 1—The ACE value of a cycle is equal to the EMD of this cycle if any subset of the variable nodes in this cycle does not form a cycle except the cycle itself.

Figure 3:
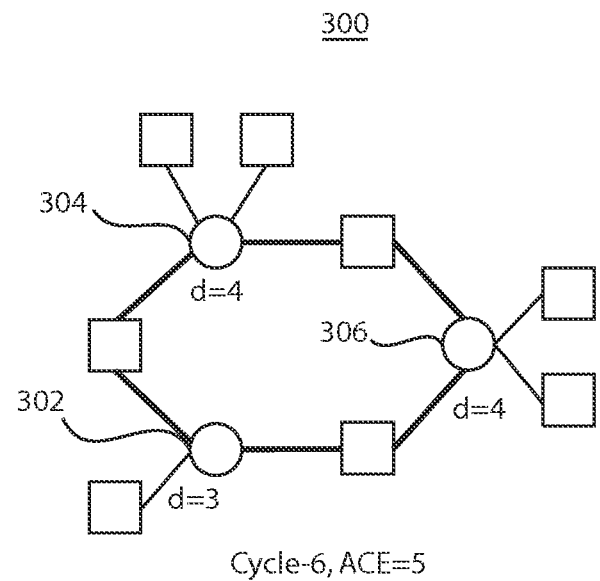
FIG. 3 is a code subgraph of an LDPC code illustrating the ACE of a cycle in accordance with exemplary embodiments of the present invention.

With reference to FIG. 3, a code graph 300 illustrating property 1 is provided. If any subset of the variable nodes in a given cycle does not form another cycle, any two variable nodes in the given cycle do not connect to the same check node that is not in the cycle. Thus, all the extrinsic check nodes for the variable nodes in the cycle are distinct. As such, the upper bound of the ACE of the cycle is achieved. As shown in FIG. 3, a cycle of length-6 has three variable nodes 302, 304 and 306 of degree-3, 4, and 4, respectively. Therefore, the ACE value is 5. If there is no overlapping among the extrinsic check nodes connected the variable nodes in the cycle, then the ACE is the EMD.

Using the two metrics EMD and ACE, an ACE algorithm has been proposed to construct an LDPC code to have a guaranteed graph property ($d_{ACE},\eta$), i.e., the cycles of length-2 $d_{ACE}$, or less have the ACE values of $\eta$ or more.

In contrast to prior works, the present invention introduces two new metrics: the local girth for a variable node and the local minimum ACE.

Definition 5—Local girth: The local girth of a variable node is the length of the shortest cycle among all the cycles that are connected to this variable node.

Definition 6—Local minimum ACE: The local minimum ACE of a variable node is defined as the smallest ACE value of all cycles connected to this variable node having a length that is equal to the local girth of this variable node.

It should be noted that for all the cycles of a variable node that have the same length as the local girth, the ACE values of these cycles can be different. Further, the definition of local minimum ACE is different from the ACE definition. For example, the local minimum ACE is a parameter of a variable node and is dependent on the cycles including this variable node. In contrast, the ACE is either a parameter of a particular cycle or a parameter of a variable node without any cycle information.

Figure 4:
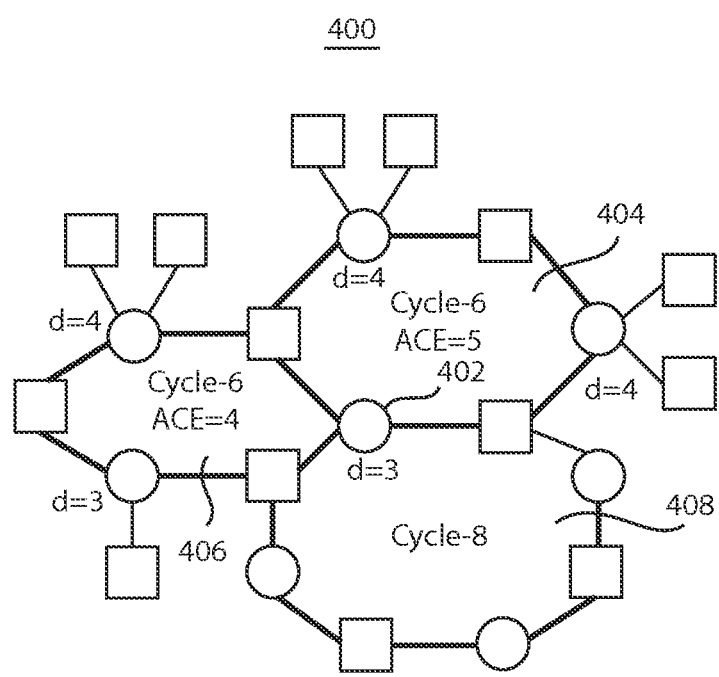
FIG. 4 is a code subgraph of an LDPC code illustrating a local girth and a local minimum ACE of a variable node in accordance with exemplary embodiments of the present invention.

With reference now FIG. 4, a code graph 400 providing an example of local girth and local minimum ACE is illustrated. It is clear that for the variable node u 402, three cycles, 404, 406 and 408, that connect to u 402 are formed. The lengths of cycles 404, 406 and 408 are length-6, length-6 and length-8, respectively. Therefore, the local girth of u 402 is 6. Among two cycles 404 and 406 having a length of 6, cycle 404 has an ACE of 5 while cycle 406 has an ACE of 4. Thus, the local minimum ACE of variable node u is 4.

Using the two new metrics local girth and local minimum ACE, the constraints for variable nodes can be set to construct a code graph. For example, the metrics may be used to construct structured QC-LDPC codes. Based on the quasi-cyclic property of the code matrix in equation (2) and the cyclic property of the codeword shown in equation (5), the following property on the local girth and local minimum ACE for QC-LDPC codes is obtained.

Property 2: For a QC-LDPC code, the nodes representing the columns located in the same circulant in the QC parity-check matrix have the same local girth and the same local minimum ACE.

Due to Property 2, the local girth, $g_l$, and the local minimum ACE, $\eta_l^{min}$, can be used to represent the graph property of a group of variable nodes, or in other words, the property of a node in the protograph or a column in the base matrix in equation (4). Therefore, if the constraints on these two metrics, $g_l$ and $\eta_l^{min}$, are set, $g_l$ and $\eta_l^{min}$ can be evaluated for only one node in a circulant group to verify that each of the variable nodes in the circulant group meet the constraints on $g_l$ and $\eta_l^{min}$. Accordingly, $g_l(n)$ and $\eta_l^{min}(n)$ are denoted as the local girth and the local minimum ACE of the nodes for the nth column in $H_B$.

Construction of QC-LDPC with Various Lift Sizes

To construct QC-LDPC codes with various lifting sizes, the following structure for QC-LDPC code matrix can be employed:

$$H=[H_{sys}H_p], \quad (6)$$

where $H_{sys}$ and $H_{sys}$ correspond to the information bits and the parity bits, respectively. Further, $$H_{sys} = \begin{bmatrix} P^{\alpha_{11}} & P^{\alpha_{12}} & \ldots & P^{\alpha_{1K_B}} \\ P^{21} & P^{\alpha_{22}} & \ldots & P^{\alpha_{2K_B}} \\ \vdots & \vdots & \ldots & \vdots \\ P^{\alpha_{M_B 1}} & P^{\alpha_{M_B 2}} & \ldots & P^{\alpha_{M_B K_B}} \end{bmatrix}, \quad (7)$$

where $K_B=K/L$.

The parity submatrix $H_p$ is formed by two parts with one submatrix $h_d$ of size $M_B L \times L$ and one submatrix $H_2$ of size $M_B L \times (M_B-1)L$, given by $$H_p = [h_d H_2], \quad (8)$$

where $$H_2 = \begin{bmatrix} I & 0 & \cdots & 0 \\ I & I & \ddots & 0 \\ 0 & I & \ddots & \vdots \\ \vdots & \ddots & \ddots & I \\ 0 & \cdots & 0 & I \end{bmatrix}, \text{ and } h_d = \begin{bmatrix} P^{\alpha_{1,K_B+1}} \\ \vdots \\ P^{\alpha_{M_B,K_B+1}} \end{bmatrix}. \quad (9)$$

For efficient encoding, the degrees of the nodes for $h_d$ can be set as 3, i.e., $$h_d = \begin{pmatrix} P^{\alpha_{1,K_B+1}} \\ 0 \\ \vdots \\ P^{\alpha_{m,K_B+1}} \\ 0 \\ \vdots \\ P^{\alpha_{M_B,K_B+1}} \end{pmatrix}. \quad (10)$$

It can be shown that, to ensure the efficient encoding, the following is obtained:

$$\alpha_{M_B,K_B+1} \equiv \alpha_{1,K_B+1} \bmod L \text{ and } \alpha_{m,K_B+1} \equiv 0, \quad (11)$$

$$\text{or } \alpha_{1,K_B+1} \equiv 0 \text{ and } \alpha_{M_B,K_B+1} \equiv \alpha_{m,K_B+1} \bmod L. \quad (12)$$

Thus, QC-LDPC codes can essentially be designed by constructing the code submatrix $H_{sys}$ and $h_d$ given in (10). To design the QC-LDPC codes for variable block lengths, instead of designing the code matrix $H$ or the base matrix $H_B$ with different sets of cyclic shifts $\{\alpha_{i,j}\}$ for different $L$, in accordance with exemplary aspects of the present invention, a universal base matrix $\tilde{H}_B$ can be designed, which is given by $$\tilde{H}_B = \begin{bmatrix} \beta_{11} & \beta_{12} & \cdots & \beta_{1N_B} \\ \beta_{21} & \beta_{22} & \cdots & \beta_{2N_B} \\ \vdots & \vdots & \cdots & \vdots \\ \beta_{M_B 1} & \beta_{M_B 2} & \cdots & \beta_{M_B N_B} \end{bmatrix} \quad (13)$$

with cyclic shifts $\{\beta_{ij}\}$ fixed for every $L = L_{min}, \ldots, L_{max}$, where $L_{min}$ and $L_{max}$ denote the minimum and the maximum lift size employed in the system, respectively. For each $L$, a straightforward mapping from $\{\beta_{ij}\}$ to $\{\alpha_{ij}^{(L)}\}$ can comprise letting $$\alpha_{ij}^{(L)} = \beta_{ij}, i=1, \ldots, M_B; j=1, \ldots, N_B. \quad (14)$$

The following mapping function can be employed:

$$\alpha_{ij}^{(L)} = \begin{cases} \beta_{ij}, & \beta_{ij} \leq 0, \\ \left\lfloor \dfrac{\beta_{ij} L}{L_{max}} \right\rfloor, & \beta_{ij} > 0. \end{cases} \quad (15)$$

Design Criterions

Prior to discussing specific, exemplary method and system embodiments of the present invention, a brief discussion of possible design criterions involving, girth, local girth and local minimum ACE constraints are described.

With regard to girth conditions or constraints, although a large, universal girth condition for a whole graph is generally too strict for effective code design, especially the design of a QC-LDPC code base matrix for various block lengths, small cycles should be avoided in the code graph. For the design of LDPC codes with a moderate code rate, a girth condition, g, can be set so that all the cycles in the code graph have lengths that are equal to or larger than g. In exemplary embodiments of the present invention, g can be set to 6, i.e., all cycles of length-4 are eliminated.

With regard to local girth and local minimum ACE constraints, in an LDPC code graph built by the ACE code design algorithm mentioned above, the cycles of length-2 $d_{ACE}$ or less have the ACE values of $\eta$ or more. In contrast, exemplary embodiments of the present invention introduce constraints on the local girth and the local minimum ACE. For the nth column in the base matrix $H_B$, if the local girth is $g_l(n) < 2d_{ACE_m}(n)$, the local minimum ACE should satisfy $\eta_l^{min}(n) \geq \eta_{ACE_m}(n)$. This condition can be termed the nth column satisfy the local girth and minimum ACE condition or constraint, $(2d_{ACE_m}(n), \eta_{ACE_m}(n))$. It should be noted that if a girth condition is satisfied, then $g_l(n) \geq g$ for all $n=1, \ldots, N_B$.

Two variations of the above local girth and minimum ACE constraint can additionally or alternatively be employed. The first variation involves simplifying the $(2d_{ACE_m}(n), \eta_{ACE_m}(n))$ constraint as follows. Here, one parameter instead of two can be used to set the design criterion by making the sum of the local girth and the local minimum ACE of a given node greater than a threshold value $a_{g,ACE_m}(n)$ for the given node, i.e., $$g_l(n) + \eta_l^{min}(n) \geq a_{g,ACE_m}(n). \quad (16)$$

An exemplary second variation can involve expressing the local girth and local minimum ACE constraint $(2d_{ACE_m}(n), \eta_{ACE_m}(n))$ in a detailed form, given by $$\text{If } g_l(n) = 2d_{ACE_m}^{(q)}(n), \eta_l^{min}(n) \geq \eta_{ACE_m}^{(q)}(n), \\ q=1, \ldots, Q \quad (17)$$

Thus, several pairs of settings can be defined in the second variation of the local girth and minimum ACE constraints. In exemplary methods and systems discussed herein below, both variations on the local girth and local minimum ACE constraints can be respectively applied for different lift sizes.

It should also be noted that other design conditions or constraints on the local girth and the local minimum ACE can be employed. For example, for the QC-LDPC code matrix with the structure given in equations (6) and (8), for simple encoding, move protections can be applied to parity nodes due to small degrees (degree-2). The following constraint on the parity nodes can be set using the local girth, given by $$|\Omega_{H_p,g_p}| \leq \tau, \text{ with } \Omega_{H_p,g_p} = \{n | g_l(n) \leq g_p, K_B + 1 \leq n \leq N_B\}. \quad (18)$$

It is clear that $\Omega_{H_p,g_p}$ denotes the set of columns corresponding to the parity node portion ($K_B \leq 1 \leq n \leq N_B$) in the base matrix that have local girths that are less than or equal to a certain threshold $g_p$. To add protections on the parity nodes, the design condition or constraint in equation (18) limits the number of small local girths (equal to or smaller than $\tau$) for the parity nodes.

Similarly, for all columns in the base matrix another local girth and local minimum ACE constraint can be set:

$$|\Omega_{H_p,\vec{a}}| \leq \tau, \text{ with } \Omega_{H_p,\vec{a}} = \{n | g_l(n) + \eta_l^{min}(n) \leq a_{g,ACE_m}, 1 \leq n \leq N_B\}. \quad (19)$$

where $\Omega_{H_B,\bar{a}}$ denotes the set of columns in the base matrix that have a local girth and a local minimum ACE that satisfy $g_l(n)+\eta_l^{min}(n) \leq \bar{a}_{g,ACE_m}$. Similar to the design constraint in equation (18), the design condition or constraint in equation (19) limits the number of small local girths with small local minimum ACEs.

It should be noted that for the design conditions described above, the parameters, including $\{(2d_{ACE_m}(n), \eta_{ACE_m}(n))\}$, $\{a_{g,ACE_m}(n)\}$, $\{(2d_{ACE_m}^{(q)}(n), \eta_{ACE_m}^{(q)}(n))\}$, g, $\tau$, $g_p$, and $\bar{a}_{g,ACE_m}$ can be changed for different lift sizes L. In particular, the design constraints can be adjusted at a fine granularity of the lifting size. With different settings, the graph constraints can be gradually loosened as L decreases, which facilitates efficient design of one base matrix that can have many lifting sizes.

Specific Method and System Embodiments

Figure 5:
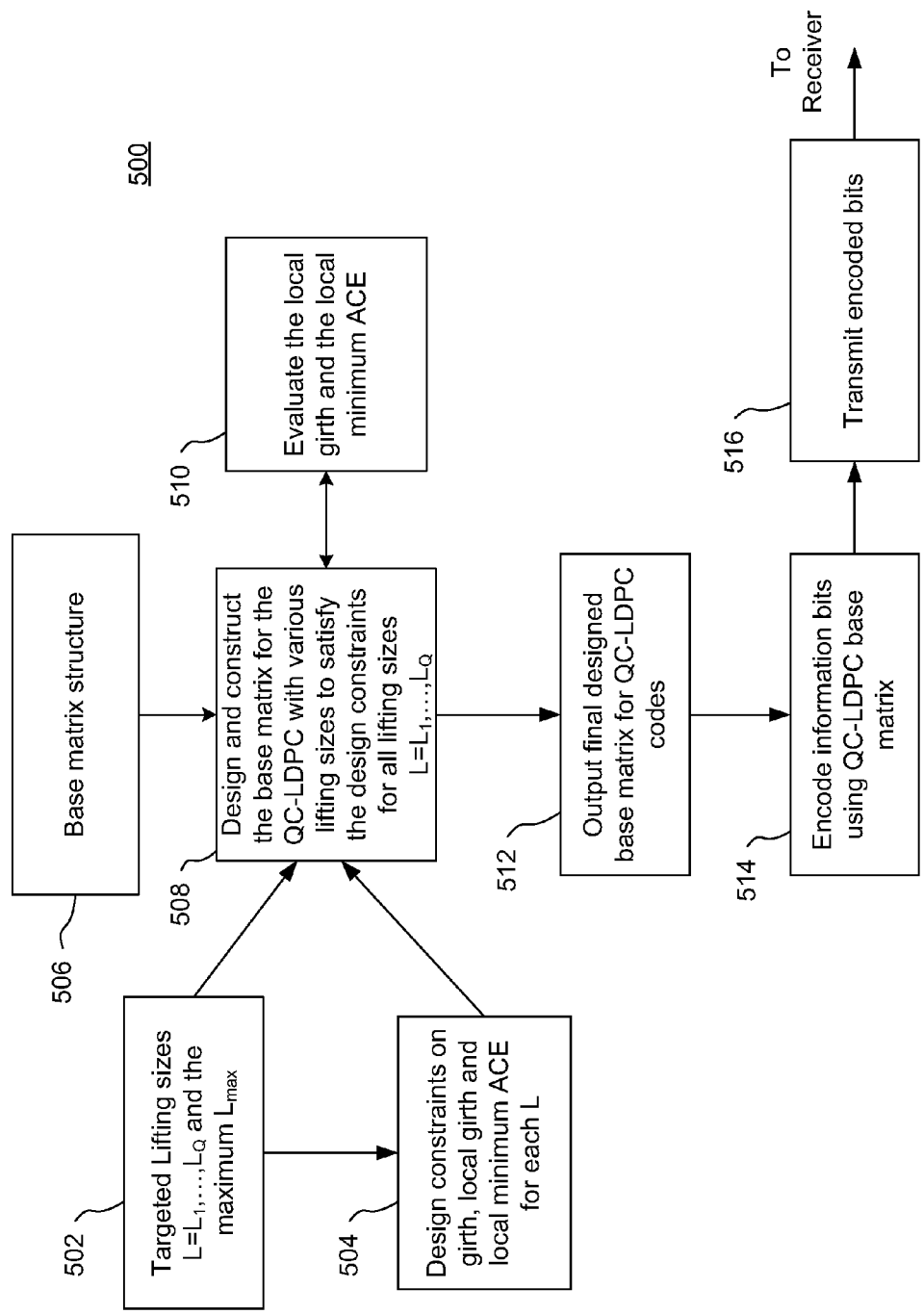
FIG. 5 is a block/flow diagram of a system/method for constructing a QC-LDPC base matrix for encoding information bits in accordance with exemplary embodiments of the present invention.

Referring now to FIG. 5, a block/flow diagram of a system/method 500 for constructing a QC-LDPC base matrix for encoding information bits in accordance with an exemplary embodiment of the present invention is illustrated. System/method 500 can include a design module 508 that can be configured to design and construct the entries of a base matrix that can have different lifting sizes from which a set of well-performing QC-LDPC codes for various block lengths can be obtained.

To design the base matrix, the targeted lifting sizes, $L=L_1, \ldots, L_Q$, and the maximal lifting size $L_{max}$ can be set and can be received by a design module 508, as shown in FIG. 5. Here, $L_{max}$ can be set as $L_{max}=L_Q$. Further, the lifting sizes can be input by a user or automatically generated by a lifting size generator 502. Based on the targeted lifting size and the maximal lifting size, design conditions/constraints on girth, local girth and local minimum ACE can be set for each L and received by the design module 508. The constraints can also be input by a user or can be generated automatically by a constraints module 504. The design constraints can be formulated in any of a variety of ways, including any one or more of the formulations of the design constraints described above. For example, the girth condition on the base matrix can be set such that all the cycles have a length that is greater than or equal to g, the girth of the QC-LDPC code.

In addition, the local girth $g_l(n)$ and local minimum ACE $\eta_l^{min}(n)$ constraints can be defined for any given node n as $(2d_{ACE_m}(n), \eta_{ACE_m}(n))$. In other words, if the local girth $g_l(n)<2d_{ACE_m}(n)$, the local minimum ACE $\eta_l^{min}(n)>\eta_{ACE_m}(n)$. Alternatively or additionally, as noted above, the local girth $g_l(n)$ and local minimum ACE $\eta_l^{min}(n)$ constraints can be defined as $g_l(n)+\eta_l^{min}(n) \geq a_{g,ACE_m}(n)$. In accordance with these constraints, the sum of the local girth and the local minimum ACE is constrained to be greater than or equal to a threshold value, $a_{g,ACE_m}(n)$. Alternatively or additionally, as discussed above, for different local girth values, different constraints (lower bound) on the local minimum ACE can be set. For example, the local girth $g_l(n)$ and local minimum ACE $\eta_l^{min}(n)$ constraints can be defined as: if $g_l(n)=2d_{ACE_m}^{(q)}(n)$, $\eta_l^{min}(n) \geq \eta_{ACE_m}^{(q)}(n)$, $q=1, \ldots, Q$.

Other variations can include conditions on the number of columns of the base matrix that satisfy certain graph constraints on the local girth and the local minimum ACE. For example, as stated above, for QC-LDPC codes with structures suitable for efficient low-complexity encoding (accumulator structure), move protections on the degree-2 parity nodes can be set by defining the local girth $g_l(n)$ and local minimum ACE $\eta_l^{min}(n)$ constraints as $|\Omega_{H_p,g_p}| \leq \tau$, with $\Omega_{H_p,g_p}=\{n|g_l(n) \leq g_p, K_B+1 \leq n \leq N_B\}$. Here, the number of columns in the parity portion of the matrix with a local girth smaller than $g_p$ should be smaller than a certain threshold $\tau$. Alternatively or additionally, as discussed above, the number of columns in the base matrix with a local girth and a local minimum ACE satisfying $g_l(n)+\eta_l^{min}(n) \leq \bar{a}_{g,ACE_m}$ can be constrained to be smaller than a certain threshold $\tau$. Namely, the local girth $g_l(n)$ and local minimum ACE $\eta_l^{min}(n)$ constraints can be defined as $|\Omega_{H_B,\bar{a}}| \leq \tau$, with $\Omega_{H_B,\bar{a}}=\{n|g_l(n)+\eta_l^{min}(n) \leq \bar{a}_{g,ACE_m}, 1 \leq n \leq N_B\}$. It should be noted that the local girth and local minimum ACE constraints can progressively vary with increasing or decreasing lift sizes. For example, as discussed above, the graph constraints can be gradually loosened as L decreases.

To illustrate an exemplary format of design constraints that can be used, equations (20) and (21) are provided below as specific examples of design constraints including local girth and local minimum ACE constraints that can be employed by the design module 508 to design the base matrix for QC-LDPC codes.

$$\begin{cases} \text{Girth: } g = 6, \\ \text{If } g_l(n) = 8, \eta_l^{min}(n) \geq 5, \text{ and if } g_l(n) = 6, \\ \eta_l^{min}(n) \geq 8, n = 1, \ldots, N_B, \forall L, \\ |\Omega_{H_p,g_p=6}| \leq 2 \text{ for } L \geq 40, \\ |\Omega_{H_B,\bar{a}=13}| \leq 8 \text{ for } L \geq 40. \end{cases} \quad (20)$$

$$\begin{cases} \text{Girth: } g = 6, \\ \text{If } g_l(n) = 8, \eta_l^{min}(n) \geq 5, \text{ and if } g_l(n) = 6, \\ \eta_l^{min}(n) \geq 8, n = 1, \ldots, N_B, \forall L, \\ |\Omega_{H_p,g_p=6}| \leq 2 \text{ for } L \geq 40, \\ |\Omega_{H_B,\bar{a}=13}| \leq 8 \text{ for } 40 \leq L \leq 96, \\ |\Omega_{H_p,\bar{a}=14}| \leq 8 \text{ for } L \geq 96. \end{cases} \quad (21)$$

It should be understood that a "local girth constraint" and a "local minimum ACE constraint," as employed herein, respectively include a reference to the local minimum girth and the local minimum ACE. For example, in each of the local girth and local minimum ACE constraints described above, reference is made to $g_l(n)$ or $\eta_l^{min}(n)$. Examples include equations (16)-(19) and $(2d_{ACE_m}(n), \eta_{ACE_m}(n))$, which implicitly references $g_l(n)$ and $\eta_l^{min}(n)$: if the local girth $g_l(n)<2d_{ACE_m}(n)$, the local minimum ACE $\eta_l^{min}(n)>\eta_{ACE_m}(n)$.

Figure 7:
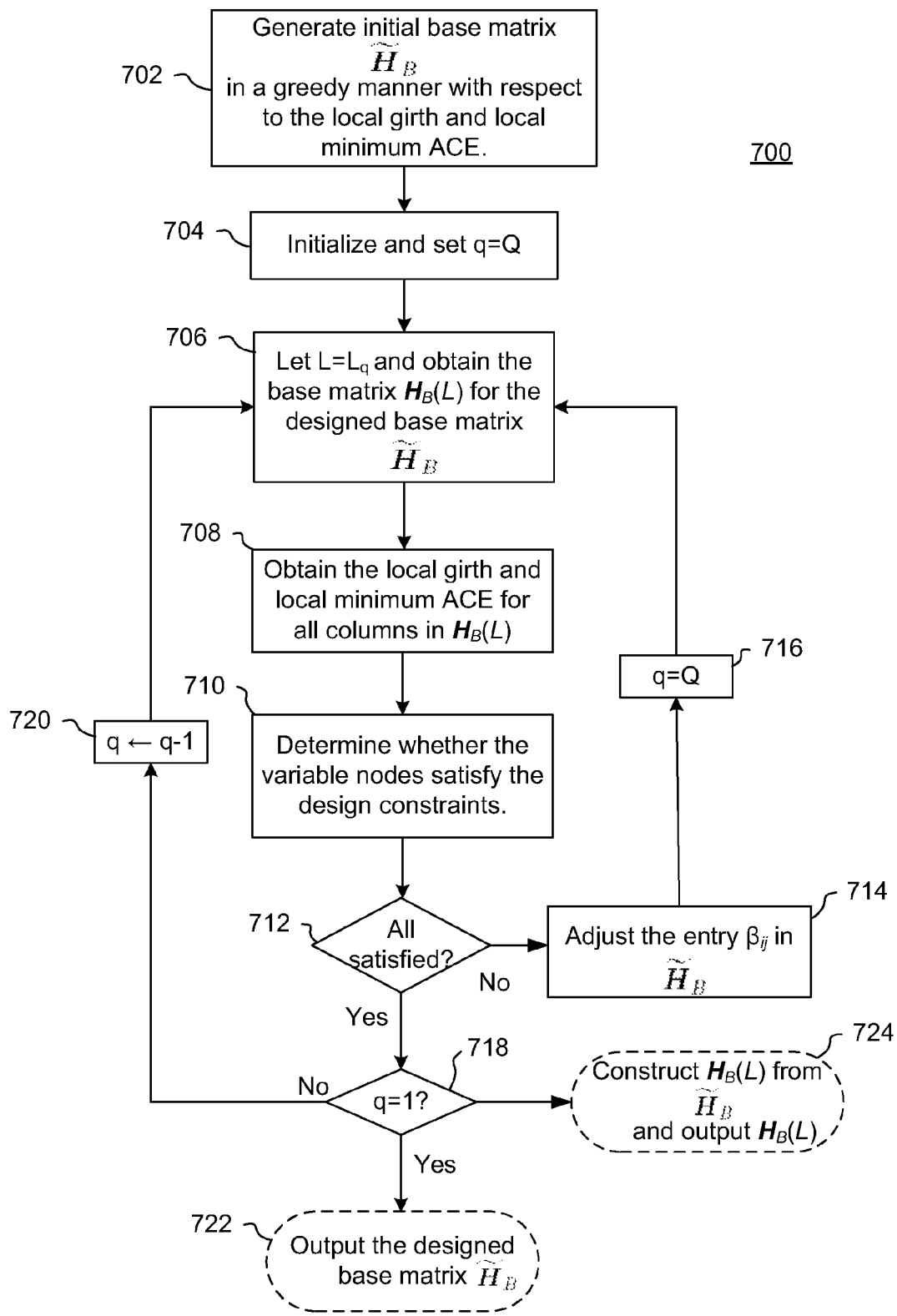
FIG. 7 is a block/flow diagram of a method for constructing a QC-LDPC base matrix in accordance with exemplary embodiments of the present invention.

To construct the base matrix, the design module 508 may also receive a base matrix structure that can be input by user or can be generated by a structure generator 506. For example, the base matrix may correspond to the universal base matrix $\tilde{H}_B$ from which various other base matrices with different lift sizes can be obtained by cyclically shifting index entries $\beta_{ij}$. Further, the base matrix structure may correspond to that described above with respect to equations (8)-(12). Alternatively or additionally, the base matrix structure may correspond to base matrix $H_B$ directly, which has a specific lift size. Thus, using the targeted lift sizes, the design constraints and the base matrix structure, the design module 508 can design and construct a base matrix for QC-LDPC codes with various lifting sizes that satisfies the design constraints. FIG. 7, discussed in more detailed below, provides one specific method 700 for designing and constructing base matrix $\tilde{H}_B$ that can be implemented by the design module 508. Specifically, method 700 can be employed to design and construct the cyclic shift index entries $\beta_{ij}$ in one base matrix base matrix $\tilde{H}_B$ that can be applied to different lifting sizes. However, it should be understood that method 700 can be used or modified to generate a base matrix $H_B$ having a specific lift size that forms the basis of QC-LDPC codes, as discussed further herein below with respect to method 700.

The design module 508 can also utilize an evaluation module 510 to evaluate the local girth and the local minimum ACE constraints of potential base matrices constructed by the design module. For example, for a given matrix $H_B$, which can be obtained from the base matrix $\tilde{H}_B$, the evaluation module 510 can evaluate and determine the local girth and local minimum ACE for all columns of $H_B$. One exemplary process for determining the local girth and local minimum that can be implemented by the evaluation module 510 is discussed in more detail below with respect to FIG. 6. After receiving the local girth and the local minimum ACE values for variable nodes in $H_B$, the design module 508 can determine whether $H_B$, having a specific lift size, satisfies the design constraints using the values. Thus, using the evaluation module, the design module 508 can iteratively construct $H_B/\tilde{H}_B$ until a base matrix satisfying the design constraints for all targeted lift sizes values is found, as discussed in more detail below.

In block 512, the final designed base matrix can be output. In turn, an encoder 514 encode information bits from the QC-LDPC base matrix for transmission to a receiver. For example, if the base matrix is $H_B$, the encoder 514 can lift the base matrix $\tilde{H}_B$ to obtain H matrices from which QC-LDPC codes can be formulated. Of course, $\tilde{H}_B$ can also be used directly for lift size L=0. Alternatively, the design module 508 may output different base matrices $H_B$ with different lift sizes to the encoder 514. A transmitter 516 may thereafter receive the coded bits and transmit them to a receiver.

It should be understood that embodiments described herein may be entirely hardware or may include both hardware and software elements. In particular, each of the elements of system/method 500 and any and all elements discussed below with respect to FIGS. 6 and 7 can be implemented in hardware and/or hardware and software. In a preferred embodiment, the present invention is implemented in hardware and software, which includes but is not limited to firmware, resident software, microcode, etc.

Embodiments may include a computer program product accessible from a computer-usable or computer-readable storage medium providing program code for use by or in connection with a computer or any instruction execution system. A computer-usable or computer readable storage medium may include any apparatus that stores the program for use by or in connection with the instruction execution system, apparatus, or device. The medium can be magnetic, optical, electronic, electromagnetic, infrared, or semiconductor system (or apparatus or device). The medium may include a computer-readable storage medium such as a semiconductor or solid state memory, magnetic tape, a removable computer diskette, a random access memory (RAM), a read-only memory (ROM), a rigid magnetic disk and an optical disk, etc. In particular, the present invention may be implemented in a computer readable storage medium tangibly embodying a computer readable program including instructions executable by a computer to perform any one or more method steps described herein.

Figure 6:
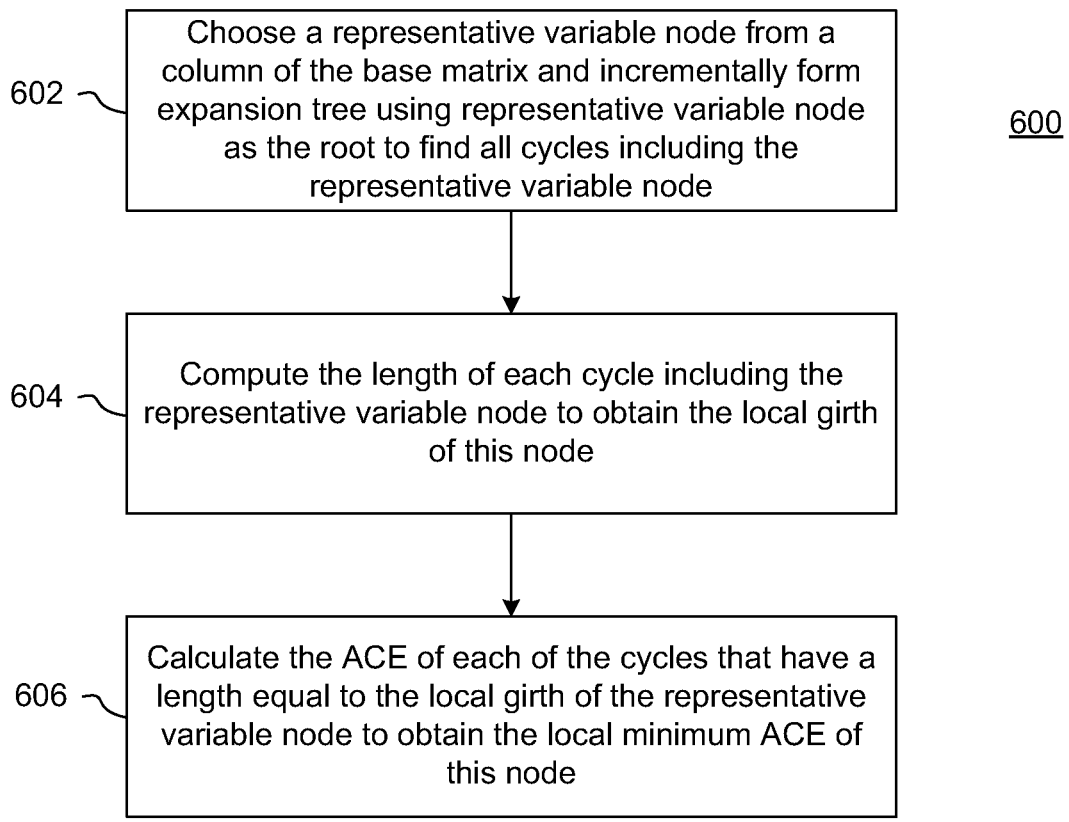
FIG. 6 is a block/flow diagram of a method for determining the local girth and the local minimum ACE of a variable node in accordance with exemplary embodiments of the present invention.

Referring now to FIG. 6 with continuing reference to FIG. 5, a method 600 for determining the local girth and the local minimum ACE of nodes in a base matrix in accordance with one exemplary embodiment of the present invention is illustrated. Specifically, method 600 can be used to obtain the local girth $g_l(n)$ and the local minimum ACE $\eta_l^{min}(n)$, $n=1, \ldots, N_B$, for a given code matrix with a lifting size L. As noted above, method 600 can be implemented by the evaluation module 510.

Method 600 can begin at step 602 in which the evaluation module 510 may choose a representative variable node from one of the columns of the base matrix $H_B$ and may incrementally form an expansion tree rooted with the representative variable node to find all cycles including the representative variable node. As noted above, one property of the local girth and local minimum ACE metrics for QC-LDPC codes is that all nodes within a circulant or a column of a base matrix have the same local girth and local minimum ACE. Accordingly, the evaluation module 510 can evaluate only one representative variable node from a circulant or a column of a base matrix to determine the local girth and local minimum ACE of all variable nodes in the circulant or column. To build the expansion tree using the representative variable node as a root, all the check nodes connected to the root variable node can be found and can act as the root variable node's descendants. For every descendant check node found, the evaluation module 510 can find all its descendant variable nodes that are connected to this check node. The process continues until the evaluation module obtains an expansion tree for the code graph. Further, the evaluation module can assign every node an identification (ID). Here, the same generation of descendants is referred to as a layer. For every layer, if two identical nodes are encountered by the evaluation module, a cycle is found.

At step 604, the evaluation module can compute the length of each cycle including the representative variable node to obtain the local girth of the representative variable node. For example, after finding a cycle in the expansion tree, the evaluation module can trace back through the cycle to find the length of cycle as well as the ACE of the cycle. After finding a cycle, the evaluation module should trace back to the root node of the expansion tree to ensure that the cycle is relevant in determining the local girth. Based on the definition of the local girth provided above, only cycles that include the root node are relevant for determining the local girth of the root node. Therefore, if the evaluation module 510 finds two identical nodes in one layer, the evaluation module 510 should trace back to the root node in the tree. If the search stops at some descendant layer, the evaluation module 510 should discard this cycle, even though this cycle is shorter than the local girth of the root variable. This short cycle may be the local girth of another variable node in the cycle, if there are no other shorter cycles for that variable node. To obtain the local girth of the root node, which is the representative variable node chosen in step 602, the evaluation module 510 searches for cycles layer by layer when forming the expansion tree. Thus, to obtain the local girth of the root node, the evaluation module finds a set of cycles that are formed at the lowest layer and which can be traced back to the root node, determines the length of each cycle in the set and selects the shortest cycle length as the local girth for the root node. Thereafter, the process of tree expansion can end.

At step 606, the evaluation module 510 can calculate the ACE of each cycle having a length equal to the local girth of the representative variable node to obtain the local minimum ACE of the variable node. For example, to obtain the local minimum ACE, the evaluation module 510 may evaluate all the cycles formed in the lowest layer. Specifically, the evaluation module 510 may find all the cycles connected to the lowest layer that have a length equal to the local girth of the root node, determine the ACE of each of these cycles, and select the ACE having the lowest value as the local minimum ACE. Thereafter, method 600 may repeat for another representative variable node chosen for a different column or circulant of the base matrix.

Table 1, provided below, illustrates one exemplary algorithm, Algorithm 1, for determining the local girth and the local minimum ACE for a given node u in a base matrix $H_B$ that can be used to implement method 600. As noted above, because all the nodes represented by the nth column of $H_B$ have the same local girth and the same local minimum ACE, only one node u for the nth column can be evaluated.

TABLE 1

Algorithm 1 [Find the local girth and local minimum
ACE for a given node u in a given QC-LDPC code]

1. Initialization: Set the layer number l = 0. The initial node set only includes the root node, i.e., $U_0 = \{u\}$. Set the minimum ACE$\eta^*$ to a large number and the flag of the cycle search $\Lambda = 0$.
2. For layer l = 0, 1, 2, . . .
   For every node $u_{l,j}$ in $U_l$, find its descendant nodes $D_{l+1,j}$ other than its father node $u_{l,j}$ and form the set of layer-l nodes
   $U_{l+1} = \cup_{j=1,\ldots,|U_l|} D_{l,j}$, where |.| denotes the size of set.
   Assign the ID, $\xi_{l,j}$, to the node $v_{l,j}$ in $U_l$ by its column number if $v_{l,j}$ is a variable node, or by its row number if $v_{l,j}$ is a check node.
   Assign the ACE values $\eta_{l,j}$ for node $u_{l,j}$ in $U_l$ of layer-l as follows.
   If the node $u_{l,j}$ is the root node, obtain $\eta_{l,j} = (|D_{l,j}| - 2)/2$.
   If the node $u_{l,j}$ is a variable node, obtain $\eta_{l,j} = \eta_{l-1,k}$ if $u_{l,j} \in D_{l-1,k}$, i.e., $u_{l,j}$ is the descendant of $u_{l-1,k}$.
   If the node $u_{l,j}$ is a check node, obtain $\eta_{l,j} = \eta_{l-1,k} + |D_{l,j}| - 1$.
   Search the set $U_{l,j}$ for any two nodes having the same ID number.
   Assume that $u_{l,j_1}$ and $u_{l,j_2}$ have the same ID.
   For l = l, l − 1, . . . , 0, trace back to see if they do not share any ancestor node except the root node.
   If yes, set $\Lambda = 1$ and compute the ACE of the cycle
   $\eta = \eta_{l,j_1} + \eta_{l,j_2} + |D_{l,j_1}| - 1$ if $u_{l,j_1}$ is a variable node, or
   $\eta = \eta_{l,j_1} + \eta_{l,j_2}$ if $u_{l,j_1}$ is a check node.
   If $\eta < \eta^*$, let $\eta^* = \eta$.
   If the answer is no, continue the search.
   If $\Lambda = 1$, break the loop of l and output the local girth $g_l(u) = 2l$ and the local minimum ACE$\eta_l^{min}(u) = \eta^*$ Referring now to FIG. 7, with continuing reference to FIGS. 5 and 6, a method 700 for designing and constructing a base matrix that forms the basis of QC-LDPC codes is illustrated. As mentioned above, the design module 508 can be configured to implement method 700. Method 700 can begin at step 702 in which the design module 508 may generate an initial base matrix. For example, the base matrix may be designed in a greedy manner with respect to the local girth and local minimum ACE. In addition, the base matrix may correspond to universal base matrix $\tilde{H}_B$ or, alternatively, may correspond to base matrix $H_B$, in accordance with the structure received from block 506, discussed above. If $\tilde{H}_B$ is employed, the method may begin with the maximal lifting size received from block 502, $L=L_{max}$. The initial base matrix $\tilde{H}_B$ can be generated in a greedy manner in that, for any $\beta_{ij}$ that has not been decided, the design module 508 can assign a number that incurs a large local girth with a large local minimum ACE. Table 2, provided below, illustrates one exemplary algorithm, Algorithm 2, for generating an initial universal base matrix that can be implemented in step 702.

TABLE 2

Algorithm 2 [Obtain initial QC-LDPC code matrix
$\tilde{H}_B$ with $L = L_{max}$ in a greedy manner as follows]

For i = 1, . . . , $K_B$
For j = 1, . . . , $M_B$, do
  For $\lambda = 1, \ldots, L_{max}$, do
    Set $\beta_{ij} = \lambda$.
    Obtain the local girth and the local minimum ACE for column j using Algorithm 1, $g_l(j, \lambda)$ and $\eta_l^{min}(j, \lambda)$, if $g_l(j, \lambda) \leq G$. Otherwise set $g_l(j, \lambda) = G + 1$ and $\eta_l^{min}(j, \lambda) = G + 1$.
  Find the set of $\lambda$'s, $\Gamma$, that achieve the maximum local girth and the maximum local minimum ACE. Randomly select $\alpha\lambda^* \in \Gamma$ and let $\beta_{ij} = \lambda^*$.

It should be noted that a cap G for the search of the local girth can be set to avoid unnecessary tree expansion and to reduce the design complexity. In Table 2, it is assumed that the cycles of length-G or higher (e.g., G=12) do not very much impact the performance of the resulting QC-LDPC codes.

At step 704, the adjustment process may be initialized by setting q=Q, as the process can begin with the largest lifting size $L_Q$.

At step 706, the design module 508 can set L to $L=L_q$. In addition, at step 706, the design module 508 can obtain the base matrix $H_B(L)$ from a universal base matrix $\tilde{H}_B$ generated at step 702. For example, the design module 508 may obtain entries $\alpha_{ij}^{(L)}$ in $H_B(L)$ from $\tilde{H}_B$ using a mapping function for a lifting size L, as discussed above. Alternatively, if the base matrix $H_B$ is generated at step 702, then this matrix may simply be applied here.

At step 708, the design module 508 may obtain the local girth $g_l(j)$ and the local minimum ACE, $\eta_l^{min}(j)$, j=1, . . . , $N_B$, for each column in $H_B(L)$ or $H_B$. For example, the design module 508 may provide the base matrix $H_B(L)$ or $H_B$ to the evaluation module 510, which in turn may perform method 600 to determine the local girth and the local minimum ACE for all variable nodes in the base matrix. Thereafter the design module 508 may receive the local girths and local minimum ACEs of variable nodes from the evaluation module 510.

At step 710, the design module 508 may determine whether variable nodes/entries in the base matrix $\tilde{H}_B$ or $H_B$ satisfy the design constraints received from block 504, which can include local girth and local minimum ACE constraints, as discussed above. For example, the design module 508 may determine whether the girth, the local girths and/or local minimum ACE of $H_B(L)$ or $H_B$ satisfy the design constraints. In certain exemplary embodiments, the design module 508 can examine the girth, local girth and local minimum ACE of each column received from the evaluation module 510 and mark columns that do not satisfy the any one of the girth, local girth and local minimum ACE constraints received from block 504. If any column j does not satisfy at least one of the constraints, then the column can be marked, j*=j. As noted above, the evaluation module 510 can evaluate only one variable node in a circulant or a column of the base matrix to find the local girth and local minimum ACE of each node in the circulant or column. In this way, for example, the design module can be provided with and use the local girth and/or the local minimum ACE of only one node in a circulant or column to determine whether all variable nodes in a circulant or column of the base matrix conform to the local girth and local minimum ACE constraints.

At step 712, the design module 508 can determine whether the base matrix satisfies all of the design constraints for a particular lifting size $L_q$. If the base matrix does not satisfy the design constraints, then the method may proceed to step 714, where the design module 508 may adjust an entry in the base matrix. For example, if the base matrix is $\tilde{H}_B$, then the design module 508 can adjust an entry $\beta_{ij}$ or $\beta_{ij*}$ in $\tilde{H}_B$ corresponding to the column in $H_B(L)$ that failed to satisfy one or more of the design constraints. Of course, changing $\beta_{ij}$ changes the value of $\alpha_{ij}^L$. In accordance with one exemplary embodiment, if If at step 718 it is determined that all lift sizes have been evaluated, then, at step 722, the design module 508 can optionally output the designed matrix $\tilde{H}_B$ or $H_B$ to, for example, blocks 514 and/or 516, as discussed above with respect to FIG. 5. Alternatively, at step 724, the design module may construct one or more base matrices $H_B(L)$ with different lifting sizes L by lifting the universal base matrix $\tilde{H}_B$ and may output the one or more base matrices $H_B$ (L) to, for example, blocks 514 and/or 516, for use in encoding/transmitting information bits.

Table 3, provide below, illustrates one exemplary algorithm, Algorithm 3, that can be used by the design module 508 to implement steps 706-722 of method 700.

TABLE 3

Algorithm 3 [Design of QC-LDPC codes with various lifting sizes L.]

For q = Q, Q – 1, . . . , 1, do
    Let L = $L_q$.
    Obtain the entries $\alpha_{ij}^{(L)}$ of the base matrix $H_B(L)$ for lifting size L
    by equation (15).
    Obtain the local girth $g_l(j)$ and $\eta_l^{min}(j)$, j = 1, . . . , $N_B$ for the base
    matrix $H_B(L)$.
    Girth condition: if $g_l(j) < g$, let j* = j.
    Check the local girth and local minimum ACE conditions for the given
    L. Let j* = j if the jth column does not satisfy these conditions.
    If j* ≦ $K_B$ find the check node i that is in the cycle of the node
    j* which does not satisfy the design constraint. Randomly update $\beta_{ij}*$
    with a different value.
    If j* > $K_B$ search for a pair of variable-check nodes (i', j') that is in
    the cycle with the variable node of the j*th column and j' ≦ $K_B$,
    update $\beta_{i'j'}$ randomly with a different value.
    Set L = $L_Q$.

j*≦$K_B$, then the design module 508 can be configured to find the check node i that is in the cycle of the node j* which does not satisfy the design constraint and then randomly update $\beta_{ij*}$ with a different value. In addition, if j*>$K_B$, then the design module 508 can be configured to search for a pair of variable-check nodes (i',j') that is in the cycle with the variable node of the j*th column, where j'≦$K_B$, and to update $\beta_{i'j'}$ randomly with a different value. Alternatively, if the base matrix generated at step 702 is in the form of $H_B$, then an entry corresponding to the column of $H_B$ that does not satisfy the design constraints can be randomly changed.

Thereafter, the method may proceed to step 716, in which the design module may set q as q=Q, and steps 706-712 may be repeated. It should be noted that if the base matrix generated at step 702 is in the form of $H_B$, then q can remain the same and need not be set to the maximal lifting size value, as in this case, each lifting size is individually evaluated without regard to a universal base matrix $\tilde{H}_B$.

Returning to step 712, if the base matrix satisfies all of the design constraints for lifting size $L_q$, then the method can proceed to step 718, in which the design module 508 can determine whether q=1 or, equivalently, whether the last lifting size has been evaluated. If q≠1, then the method may proceed to step 720, where the design module can decrement q by 1, and steps 705-712 can be repeated for the next lifting size. As noted above, different lift sizes may have different design constraints; thus, different iterations of steps 705-712 may be performed in accordance with different girth, local girth and/or local minimum ACE constraints. It should be noted that if the base matrix generated at step 702 is in the form of $H_B$, then the method may proceed from step 720 to step 702 and may be repeated so that a different base matrix in the form of $H_B$ with a different lift size L can be generated and evaluated.

It is clear from Algorithm 3 that if one condition is not satisfied, a new entry $\beta_{ij}$ is generated. The algorithm then starts from the beginning of L=$L_Q$ to evaluate the graph conditions and continually searching for {$\beta_{ij}$} until the base matrix $\tilde{H}_B$ satisfies all the design constraints. Therefore, it is possible that the algorithm never ends if the constraints are not appropriately set. As such, the minimum q* and $L_{q*}$ that the algorithm reaches can be monitored. If, after a certain amount of time, q* is still much larger than 1, then the algorithm can terminate and the design constraints can be adjusted by the user or, for example, by the constraints module 504.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for constructing a quasi-cyclic (QC)-low density parity check code (LDPC) base matrix for encoding information bits comprising:

a design module configured to construct the QC-LDPC base matrix based on predetermined design constraints including a local girth constraint for variable nodes imposed for at least one lift size, wherein the LDPC is constructed by copying a protograph z times and permuting the z edges (lifting) and z corresponds to a lift size; and an evaluation module configured to compute and provide the local girth of variable nodes in the QC-LDPC matrix to permit the design module to determine whether variable nodes in the QC-LDPC base matrix satisfy the local girth constraint for a corresponding lift size, wherein the design constraints further include a local minimum approximate cycle extrinsic message degree (ACE) constraint for variable nodes in the QC-LDPC base matrix.

2. The system of claim 1, wherein the design module is further configured to determine whether all variable nodes in a circulant of the base matrix conform to the local girth and local minimum ACE constraints by evaluating only one variable node in the circulant.

3. The system of claim 1, wherein the design module is configured to construct a plurality of different QC-LDPC base matrices with different lift sizes based on different local girth and local minimum ACE constraints for respective lift sizes.

4. The system of claim 3, wherein the local girth and local minimum ACE constraints progressively vary with increasing or decreasing lift sizes.

5. The system of claim 3, wherein the QC-LDPC base matrix is a universal base matrix from which base matrices with various lift sizes that satisfy the local girth and local minimum ACE constraints are obtainable.

6. The system of claim 1, wherein the local girth and local minimum ACE constraints are defined such that if the local girth for a given variable node is less than a first value for the given variable node, then the local minimum ACE for the given variable node is greater than or equal to a second value for the given variable node.

7. The system of claim 1, wherein the local girth and local minimum ACE constraints are defined such that the sum of the local girth and the local minimum ACE for a given variable node is greater than or equal to a threshold value for the given variable node.

8. The system of claim 1, wherein the local girth and local minimum ACE constraints are defined such that if the local girth for a given variable node is a first value for the given variable node, then the local minimum ACE for the given variable node is greater than or equal to a second value for the given variable node.

9. The system of claim 1, wherein the local girth constraint is defined such that the number of parity nodes, each having a corresponding local girth that is less than or equal to a first threshold, is less than or equal to a second threshold.

10. The system of claim 1, wherein the local girth constraint is defined such that the number of variable nodes, each having a sum of a corresponding local girth and a corresponding local minimum ACE that is less than or equal to a first threshold, is less than or equal to a second threshold.

11. A method for encoding information bits using quasi-cyclic (QC)-low density parity check codes (LDPC) comprising:
receiving at least one targeted lift size and at least one design constraint for a QC-LDPC base matrix including a local girth constraint for variable nodes in the QC-LDPC base matrix;
constructing the QC-LDPC base matrix based on the local girth constraint, wherein the local girth for a particular variable node is the length of the shortest cycle of all cycles connected to the particular variable node in the QC-LDPC base matrix; and
encoding the information bits in accordance with the QC-LDPC base matrix for transmission to a receiver, wherein the receiving further comprises receiving a local minimum approximate cycle extrinsic message degree (ACE) constraint for variable nodes in the base matrix, wherein the base matrix is constructed in accordance with the local minimum ACE constraint and wherein the local minimum ACE of a given variable node is the smallest ACE value of cycles connected to the given variable node having a length that is the local girth of the given variable node.

12. The method of claim 11, further comprising:
determining whether all variable nodes in a circulant of the base matrix conform to the local girth and local minimum ACE constraints by evaluating only one variable node in the circulant.

13. The method of claim 11, wherein the receiving further comprises receiving different local girth and local minimum ACE constraints for different targeted lift sizes and wherein the constructing further comprises constructing a plurality of base matrices with different corresponding targeted lift sizes from a universal base matrix in accordance with respective local girth and local minimum ACE constraints associated with the corresponding targeted lift sizes.

14. The method of claim 13, wherein the local girth and local minimum ACE constraints progressively vary with increasing or decreasing lift sizes.

15. The method of claim 11, wherein the constructing further comprises:
generating an initial universal base matrix;
for each lift size,
  evaluating whether the variable nodes in the universal base matrix satisfy the local girth and local minimum ACE constraints and,
  if an entry in the universal base matrix does not satisfy the local girth and local minimum ACE constraints, adjusting the entry, and
  repeating the evaluating and the adjustment until all entries of the universal base matrix comply with the local girth and local minimum ACE constraints; and
constructing the QC-LDPC base matrix by lifting the universal base matrix.

16. The method of claim 11, further comprising:
determining whether variable nodes of the QC-LDPC base matrix conform to the local girth and local minimum ACE constraints by
choosing a representative variable node from one of the columns of the base matrix and incrementally forming an expansion tree rooted with the representative variable node to find all cycles including the representative variable node;
computing the length of each cycle including the representative variable node to obtain the local girth of the representative variable node; and
calculating the ACE of each of said cycles that have a length equal to the local girth of the representative variable node to obtain the local minimum ACE of the representative variable node.

17. The method of claim 16, wherein said forming the expansion tree includes determining that a cycle is found if the expansion encounters the same node twice.

18. A non-transitory computer readable storage medium tangibly embodying a computer readable program including instructions which when executed by a computer generate a universal base matrix from which quasi-cyclic (QC)-low density parity check code (LDPC) base matrices with various lift sizes are obtainable for encoding information bits, the method comprising:
receiving at least one design constraint for at least one lift size including a local girth constraint and a local minimum approximate cycle extrinsic message degree (ACE) constraint for variable nodes for at least one QC-LDPC base matrix;

generating an initial universal base matrix; and for each lift size, evaluating whether variable nodes in a QC-LDPC base matrix with the corresponding lift size satisfy the local girth and local minimum ACE constraints and, if a given variable node in the QC-LDPC base matrix with the corresponding lift size does not satisfy the local girth and local minimum ACE constraints, adjusting an entry in the universal base matrix corresponding to the given variable node, and repeating the evaluation and the adjustment until all variable nodes of the QC-LDPC base matrix with the corresponding lift size comply with the local girth and local minimum ACE constraints, wherein the storage medium is accessed by a processor.

* * * * *